(12) United States Patent
Ye et al.

(10) Patent No.: US 6,724,631 B2
(45) Date of Patent: Apr. 20, 2004

(54) POWER CONVERTER PACKAGE WITH ENHANCED THERMAL MANAGEMENT

(75) Inventors: Runqing Ye, Neihu Taipei (TW); Alpha J. Zhang, Neihu Taipei (TW)

(73) Assignee: Delta Electronics Inc., Taoyuan (TW)

( * ) Notice: Subject to any disclaimer, the term of this patent is extended or adjusted under 35 U.S.C. 154(b) by 0 days.

(21) Appl. No.: 10/127,896

(22) Filed: Apr. 22, 2002

(65) Prior Publication Data

US 2003/0198022 A1 Oct. 23, 2003

(51) Int. Cl.[7] .................................................. H05K 7/20
(52) U.S. Cl. .................... 361/719; 29/890.03; 257/707; 361/705
(58) Field of Search ................ 165/80.3, 185; 363/141; 174/16.3, 252; 29/832, 840, 890.03; 438/122, 125; 257/706, 707, 709, 712, 713, 717, 720; 361/704–712, 717–720

(56) References Cited

U.S. PATENT DOCUMENTS

| | | | | |
|---|---|---|---|---|
| 4,914,551 A | * | 4/1990 | Anschel et al. | ............. 361/714 |
| 5,396,403 A | * | 3/1995 | Patel | |
| 5,883,782 A | * | 3/1999 | Thurston et al. | ............. 361/704 |
| 5,973,923 A | | 10/1999 | Jitaru | |
| 6,428,189 B1 | * | 8/2002 | Hochstein | ............. 362/373 |
| 6,432,497 B2 | * | 8/2002 | Bunyan | ............. 428/40.1 |

* cited by examiner

Primary Examiner—Gerald Tolin

(57) ABSTRACT

A package for power converters in which all parts are electrically connected with one multi-layer circuit board. A sub-package with at least a power-dissipating chip, having a bare top up-facing heat-slug is electrically connected with the board by a plurality of symmetric leads. A heat spreader is directly attached onto the bare top heat-slug of the sub-packages, planar magnetic parts and top surfaces of other components with thermally conductive insulator. The heat dissipated by the sub-packages is transferred to the attached heat spreader by the bare top heat-slug, and further transferred to the ambient. The assembly features compact and inexpensive power converter package with improved electrical performance and enhanced thermal management.

23 Claims, 6 Drawing Sheets

US 6,724,631 B2

POWER CONVERTER PACKAGE WITH ENHANCED THERMAL MANAGEMENT

FIELD OF THE INVENTION

This invention relates to the packaging and assembly of electrical components, and more particularly to the packaging and assembly for power converters with enhanced thermal management, high electrical interconnection density and low profile.

BACKGROUND OF THE INVENTION

Please refer to FIG. 1. FIG. 1 shows one approach to package electric components in a power converter according to the prior art. As shown in FIG. 1, power-dissipating devices such as 9b, 9d and a magnetic element 9c are mounted directly on a metal base-plate 6 by a thermally conductive insulator 8 for better heat transfer. The power components are electrically connected with a PCB 5a by single-lateral leads 12. The magnetic element 9c is electrically connected to PCB 5a by leaded terminals. And, other necessary components such as 9a, 9e are mounted to one side or both sides of the PCB 5a. The assembly may be encapsulated within a capsule (not shown), which acts as a heat spreader and mechanical support.

One drawback of the packaging art in FIG. 1, however, is that since the power-dissipating devices 9b, 9d are electrically connected with the PCB 5a by the single-lateral leads 12, it will be difficult to keep these devices co-planar during the mounting process, which would make the overall manufacturing process more complex, and thus would undesirably increase the manufacturing cost. Meanwhile, the leaded electrical connections of power dissipation devices as well as magnetic element will cause high interconnection parasites, which will result in additional connection resistance loss and poor converter performance especially for high current converter packaging. Moreover, the power-dissipating devices 9b, 9d are comparatively in a bigger footprint, which would inevitably cause a lower power density packaging.

U.S. Pat. No. 5,973,923 discloses another prior art approach to package electronic components in a power converter as shown in FIG. 2. In the packaging, a thermal connection from a power-dissipating device 22 to the outside is constructed, in which copper coated vias 42 are prepared by the manufacturing process of the PCB 28. The metal slug 43 of the power-dissipating device 22 is mounted onto the top pad of the copper coated vias 42, and a metal base-plate 32 is attached to the bottom pad of the copper coated vias 42 through thermally conductive insulators 30, 104. Through these copper coated vias 42, the heat is transferred from the power-dissipating device 22 to the other side of the PCB 28, and further transferred to the metal base-plate 32. The magnetic element 26b is also mounted on the PCB 28, and is connected with metal base-plate 32 by a thermally conductive soft pad 34 to enhance the heat transfer.

One drawback of the packaging art in FIG. 2, however, is that since the power-dissipating device 22 is mounted onto top-side of the copper coated vias 42, and the bottom-side of the copper coated via is occupied by the thermal connections 30, 104, the assembly reduces the electrical interconnection density of the board 28. Moreover, heat from the power device 22 will meanwhile be transferred by the copper coated vias 42 to the board 28, and thereby increases temperature rise of the board 28.

With increasing power density and current output capability of the power converter packaging, much more power-dissipating devices are to be mounted onto PCB in parallel to satisfy high current output and meanwhile to well control the conduction power losses. Thus more and more PCB lands are to be occupied by power-dissipating devices. Moreover, the power losses from power-dissipation devices and its conductive trace increase abruptly with the increase of the output current. With the increase of power density and output current, how to manage the heat from these power-dissipating devices and how to shorten the interconnection trace therebetween become very critical for power converter packaging.

SUMMARY OF THE INVENTION

It is therefore an object of the present invention to propose a packaging technology for power converters to achieve enhanced thermal management, high interconnection density, improved electrical performance as well as low cost.

To address the above-discussed deficiencies of the prior art, the present invention provides, a package for a power converter, a method of packaging a power converter and a sub-package arrangement employed in the package of the present invention. The package includes: (1) a multi-layer circuit board having a first electrically conductive surface and a second electrically conductive surface opposite to the first electrically conductive surface; (2) a heat spreader having at least a heat transfer surface; and (3) a sub-package having at least a power-dissipating chip, which is disposed between one of the electrically conductive surfaces of the multi-layer circuit board and the heat transfer surface of the heat spreader, having a bare top heat-slug in contact with the heat transfer surface of the heat spreader through a thermally conductive insulator to provide a thermally conductive pathway therebetween, and having a plurality of symmetric leads in contact with one of the electrically conductive surfaces of the multi-layer circuit board to provide an electrically conductive pathway therebetween, wherein the plurality of symmetric leads and the heat-slug are disposed in opposite orientations so that the electrically conductive pathway is separate from the thermally conductive pathway.

In one embodiment of the present invention, the plurality of symmetric leads can also be replaced by balls to meet some electrical connection requirements.

In the present invention, the sub-package, magnetic elements and other passive components of the package are fully mounted onto a multi-layer circuit board.

The unique aspect of this packaging concept is that the power-dissipating chips of the package, which are typically power semiconductors, are assembled in advance into the sub-package, therefore enabling the package to have high interconnection density. The sub-package has a bare top heat-slug and a plurality of symmetric leads (or balls), wherein the plurality of symmetric leads and the heat-slug are disposed in opposite orientations. In one embodiment of the present invention, the heat-slug is up-facing and the leads are down-facing. Of course, the heat-slug can also be down-facing and the leads be up-facing.

In the present invention, the sub-package is disposed between the electrically conductive surface of the multi-layer circuit board and the heat transfer surface of the heat spreader. In this way, the first electrically conductive surface of the multi-layer circuit board is adapted to be electrically connected with the leads of the sub-package to provide an electrically conductive pathway therebetween. The heat transfer surface of the heat spreader is adapted to be thermally connected with the heat-slug of the sub-package through a thermally conductive insulator to provide a thermally conductive pathway therebetween. The heat from the magnetic elements can also be transferred to the ambient by the attached heat spreader. Therefore, the electrically conductive pathway is separate from the thermally conductive pathway, which achieves enhanced thermal management and improved electrical performance.

In one embodiment of the present invention, the sub-package further includes control chips and passive chips. For the reason of increased packaging density and improved electrical performance, the power-dissipating chips, control chips and passive chips can be combined into one sub-package together. More specifically, the sub-package with only one chip can be simplified to be a standard surface-mounting package with a bare top up-facing heat-slug.

Another aspect of the present invention provides a method of packaging a power converter including: (1) providing a multi-layer circuit board having at least an electrically conductive surface; (2) providing a heat spreader having at least a heat transfer surface; and (3) disposing the sub-package having at least a power-dissipating chip between the electrically conductive surface of the multi-layer circuit board and the heat transfer surface of the heat spreader, the sub-package having bare top up-facing heat-slug and a plurality of symmetric down-facing leads, whereby the electrically conductive surface of the multi-layer circuit board is adapted to be electrically connected with the leads of the sub-package to provide an electrically conductive pathway therebetween; the heat transfer surface of the heat spreader is adapted to be thermally connected with the heat-slug of the sub-package with at least a power-dissipating chip through a thermally conductive insulator to provide a thermally conductive pathway therebetween; and the electrically conductive pathway is separate from the thermally conductive pathway.

Another aspect of the present invention provides a sub-package. In order to satisfy miscellaneous applications, a derivative art is proposed for the sub-package. In the art, the leaded discrete power-dissipating devices have a bare bottom heat-slug and are electrically and thermally connected with the heat-slug of the sub-package. The control devices and passive components are electrical connected with the power-dissipating devices by the conductive trace on the bottom surface of the heat-slug of the sub-package. The sub-package is electrically connected to the mother-board of a power converter by a plurality of symmetric leaded terminals or balls, and is thermally connected to the outside by the heat-slug of the sub-package. Therefore, the electrical conductive pathway of the sub-package is separate from the thermal conductive pathway.

The present invention may best be understood through the following description with reference to the accompanying drawings, in which:

DETAILED DESCRIPTION OF THE PREFERRED EMBODIMENT

Figure 1:
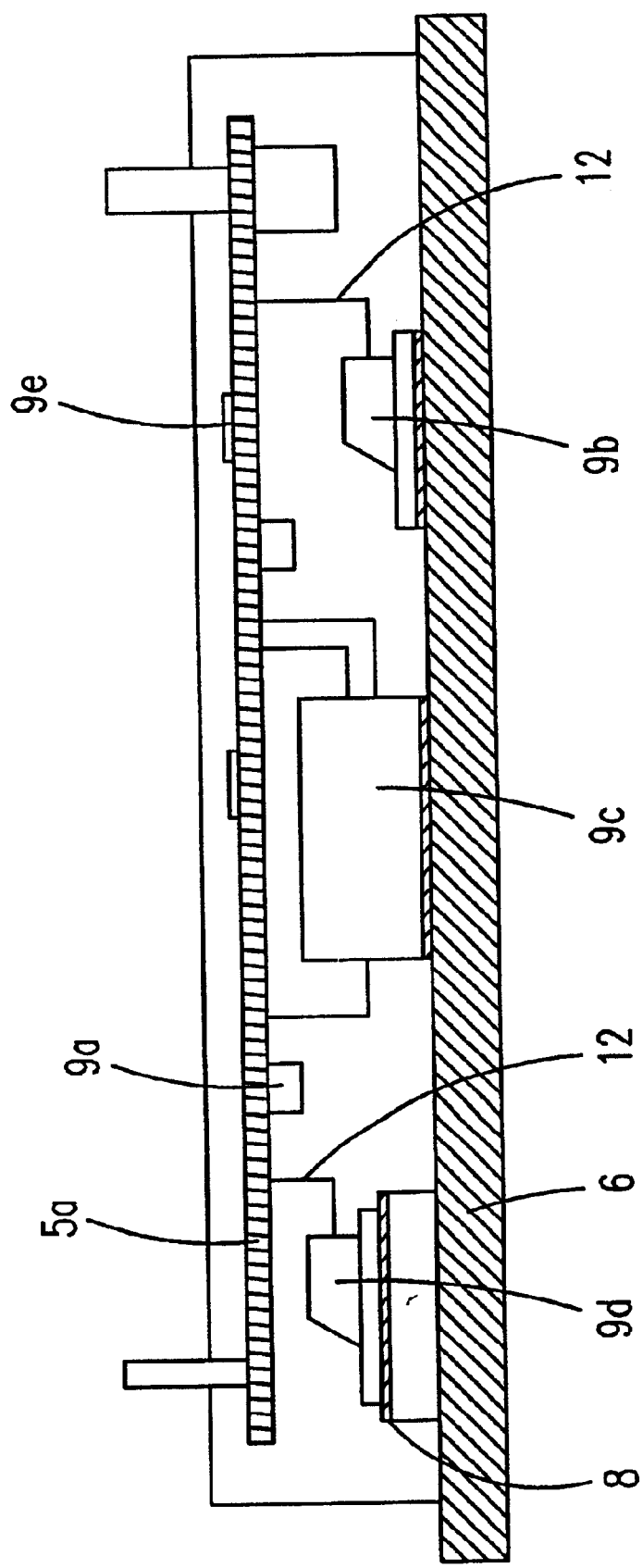
FIG. 1 is a cross-sectional side view of the prior art for a power converter package wherein a power dissipation device with single-lateral leads is attached to a metal base-plate.
Figure 2:
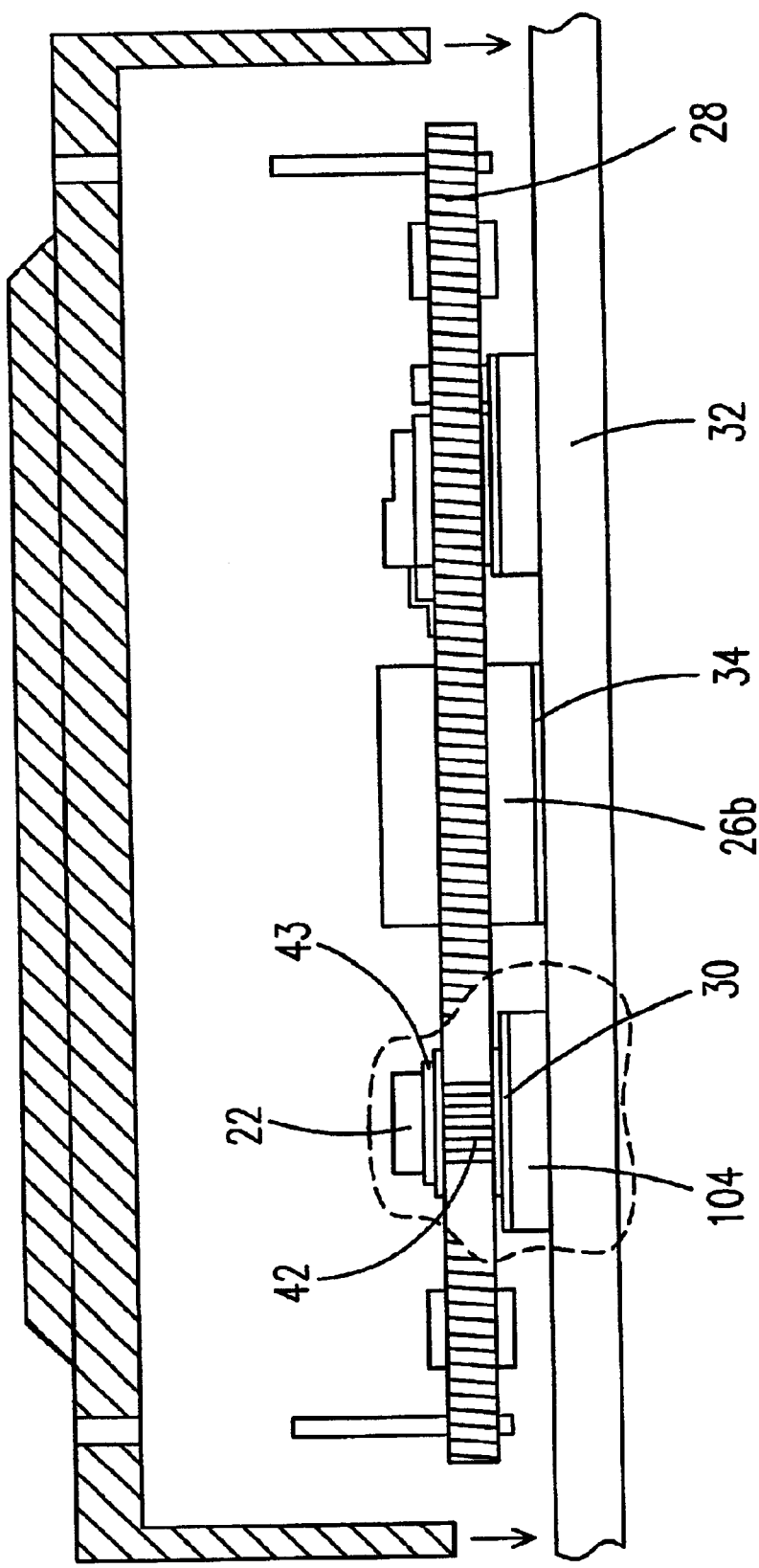
FIG. 2 is a cross-sectional side view of the prior art for a power converter package wherein heat from a power dissipation device is transferred through copper coated vias of a PCB.
Figure 3:
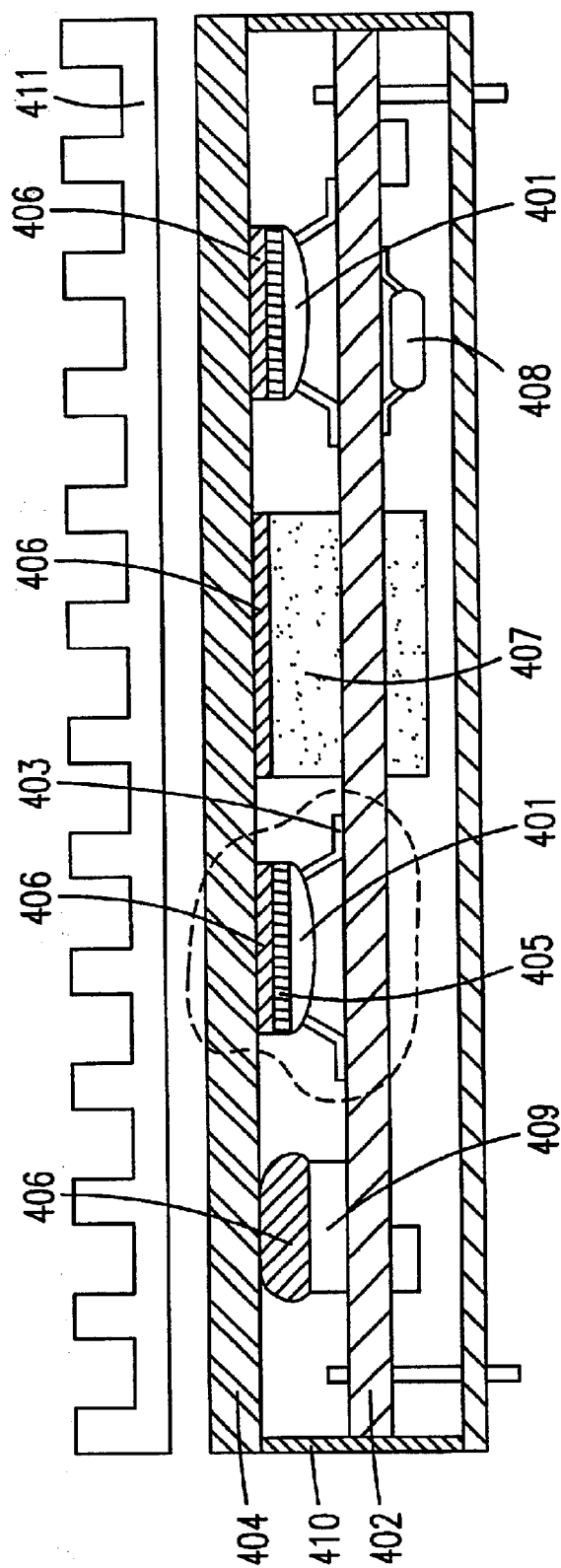
FIG. 3 is a cross-sectional side view of a power converter packaging according to the present invention, wherein the sub-package with power dissipating chips are mounted to one side of a PCB.

FIG. 3 is a cross-sectional side view of a preferred embodiment of the power converter package according to the present invention. As shown, all the electrical connections for a power converter are achieved by fully being mounted onto a multi-layer PCB 402 in order to have a high interconnection density. A heat spreader 404 is directly attached onto a bare top heat-slug 405 of the sub-packages 401 and magnetic element 407 through a thermally conductive insulator 406. The magnetic element 407 can be mounted into cutouts of the PCB 402 or be mounted onto top-side of the PCB 402. The control device 408 and passive part 409 can be mounted onto one side or both sides of the PCB 402, and the heater spreader 404 can also be attached onto them. A hard epoxy cover 410 may be applied to isolate the components from environment.

As can be seen, in the present invention, the sub-package 401 is disposed between the multi-layer PCB 402 and the heat spreader 404. In this way, the multi-layer PCB 402 is adapted to be electrically connected with the leads 403 of the sub-package 401 to provide an electrically conductive pathway therebetween. The heat spreader 404 is adapted to be thermally connected with the heat-slug 405 of sub-package 401 through a thermally conductive insulator 406 to provide a thermally conductive pathway therebetween.

The heat from the sub-package 401 can be directly transferred to the attached heat spreader 404 by the bare top heat-slug 405 of the sub-package 401, and further transferred to the outside. The electrical connection, however, is only occurred between the leads 403 of the sub-package 401 and the multi-layer PCB 402. This assembly of the package realizes that the electrically conductive pathway is separate from the thermally conductive pathway, and hence achieves an enhanced thermal management.

In applications wherein the power dissipated by the sub-package 401 cannot be easily cooled due to the limited surface of the heat spreader 404, an additional heat sink 411 can be attached to the heat spreader 404 to increase its cooling area. Hence the heat sink 411 can also be directly attached onto the bare top heat-slug 405 of sub-package 401, and the magnetic element 407 through thermally conductive insulators. The sub-package 401 is mounted onto one surface of the PCB 402 by a plurality of symmetrically arranged leads such as dual, four or round-distributed lateral leads 403, or balls, and thus has a good mechanical support for the heat spreader 404, and is easy to provide a co-plane for the sub-package 401 during the mounting process. Accordingly, there are the same number of leads 403 on any two opposite sides of the sub-package 401. Taking the round-distributed lateral leads 403 as an example, there are the same number of leads 403 on two sides with respect to an axis of the sub-package 401.

The sub-package 401 encounters a low thermo-mechanical stress since the heat-slug 405 is attached to the heat spreader 404 with the thermally conductive insulator 406. Therefore, the assembly of the present invention has not only the excellent thermal performance and high interconnection density, but good manufacturability and low cost as well.

Figure 4:
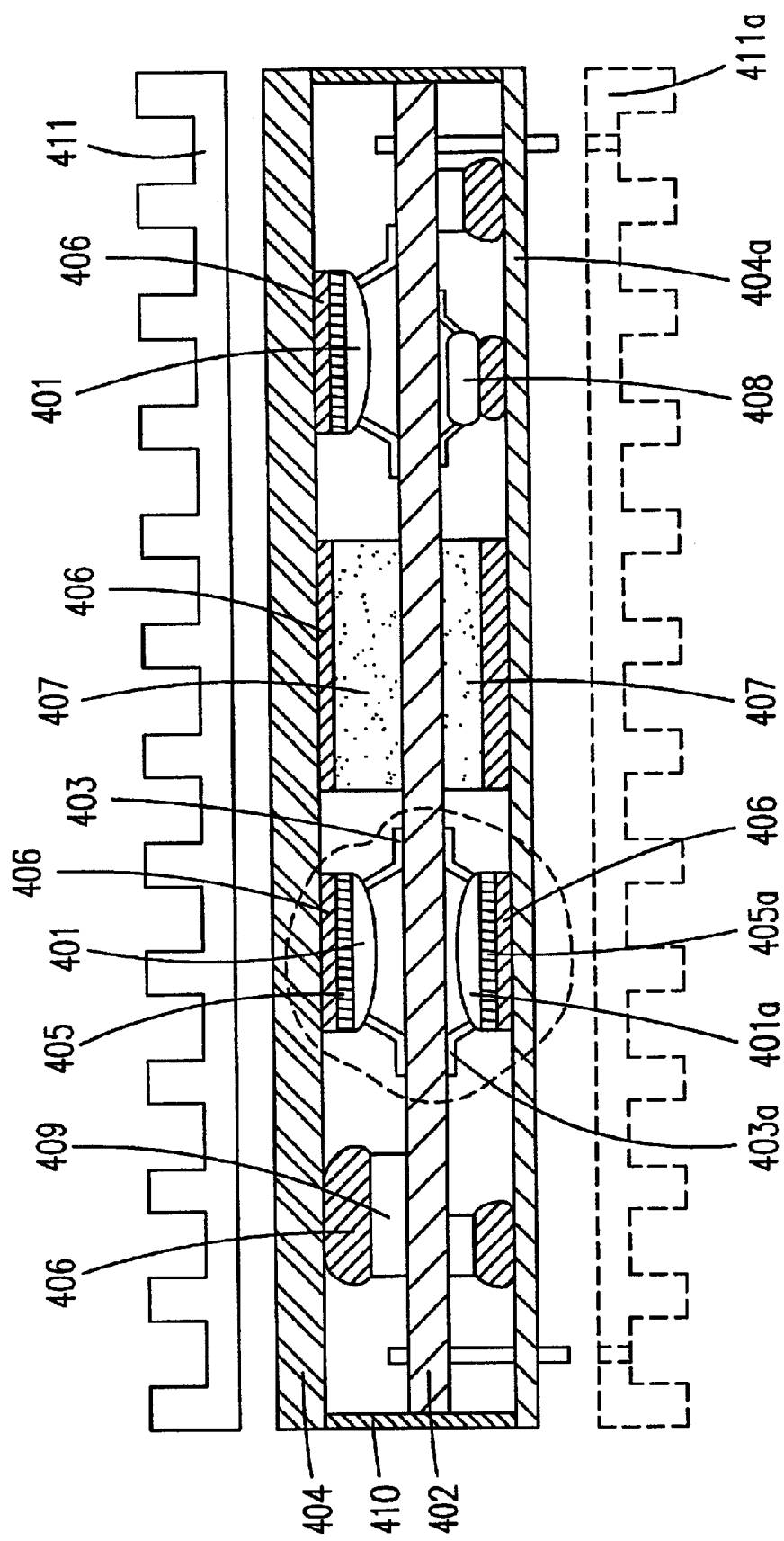
FIG. 4 is a cross-sectional side view of a power converter package according to the present invention, wherein the sub-packages with at least a power-dissipating chip are mounted to both sides of the PCB.

Those skilled in the pertinent art will understand, however, that the heat-slug 405 of the sub-package 401 can be selected from a material of metal, ceramic, metal matrix composite and insulated metal substrate and the combination thereof, whether conventional or later-developed. The plurality of symmetric leads 403 can be selected from: dual, four, and round-distributed lateral leads. The multi-layer circuit board 400 can be selected from: copper clad laminates and a ceramic hybrid circuit board. The heat spreader 404 can be selected from the group substantially consisting of: metal, ceramic, and metal matrix composite and the combination thereof In an alternative embodiment, referring to FIG. 4, the sub-package with at least a power-dissipating chip 401, 401a can also be mounted onto both sides of the PCB 402. Both heat spreaders 404, 404a can be attached from both sides of the assembly by the thermally conductive insulator 406, and thus the heat from the sub-packages 401, 401a mounted onto both sides of the PCB 402 can be directly transferred by their bare top heat-slugs 405, 405a to the heat spreaders 404, 404a, and further transferred to the outside. The magnetic element 407 can be connected with heat spreaders 404, 404a from both sides with the thermally conductive insulator 406. Other components such as control device 408 and passive component 409 with low power loss can also be thermally connected with the heat spreader from both sides. Thus the assembly further enhances thermal management of the power converter, and achieves a higher power density and a low profile power converter. The packaging approach of the present invention can also be used for vertical mounting converters.

Figure 3A:
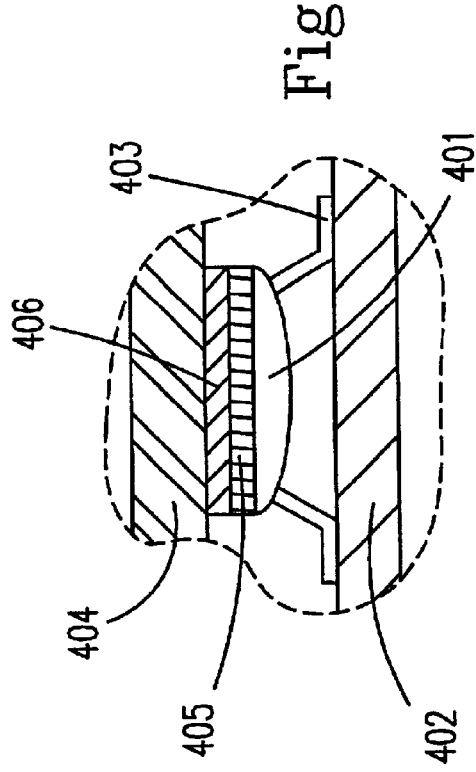
FIG. 3a is a magnified picture for assembly of the sub-package with power dissipating chips in FIG. 3.
Figure 5A:
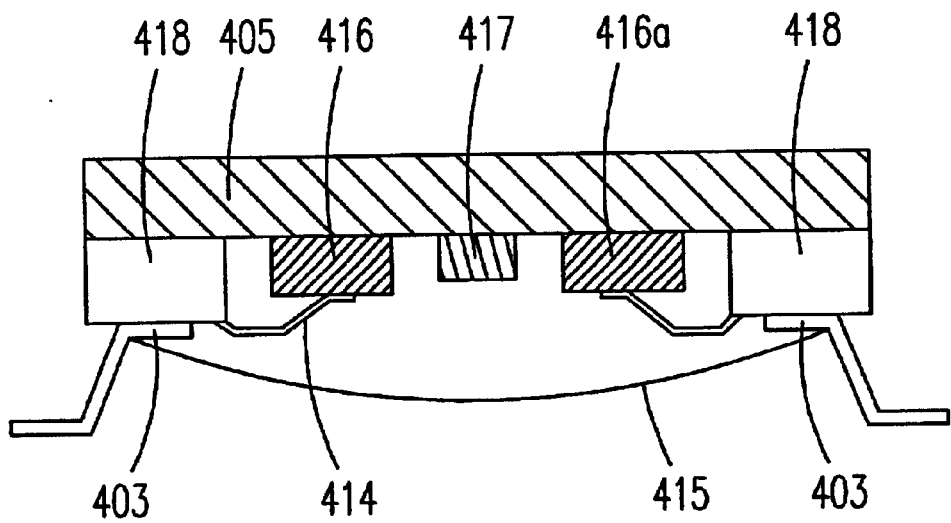
FIG. 5a is a cross-sectional side view of the sub-package with at least a power-dissipating chip, and a top heat-slug and facing down leads according to the present invention.

FIG. 5a shows the construction of the sub-package 401 in FIG. 3a used for the present invention. To improve the thermal characteristics, a development of the invention is provided in that the trimming of the leads are performed to make the bare heat-slug 405 face upwards and the leads 403 face downwards. As shown in the FIG. 5a, the power-dissipating chips 416, 416a and passive chip 417 are directly attached onto the heat-slug 405, wherein the heat-slug 405 can be isolated metal substrate (IMS) or metallizted ceramic substrate. The wire bond or tape automatic bond (TAB) 414 . . . etc. can be used for the interconnection of chip to the conductive trace 418. An epoxy or molding compound 415 can be used to seal the package and keep the outer surface of the heat-slug 405 bare. The leads 403 can be constructed in a symmetric arrangement such as dual, four or round-distributed lateral leads, wherein the trimming is performed to provide facing down leads 403 for surface mounting to PCB and to provide facing up heat-slug 405 for thermal connection. The package can be electrically connected with the PCB by leads 403. Through this assembly a heat spreader can be directly attached to the bare top heat-slug 405 with the thermally conductive insulator to achieve the thermal connection of the power-dissipating chips 416, 416a to the outside. Thus heat from the power-dissipating chips 416, 416a is transferred to the heat spreader 405 by the top heat-slug 405, and further transferred to the ambient by the heat spreader 405 and therefore the PCB can be kept cool.

Figure 5B:
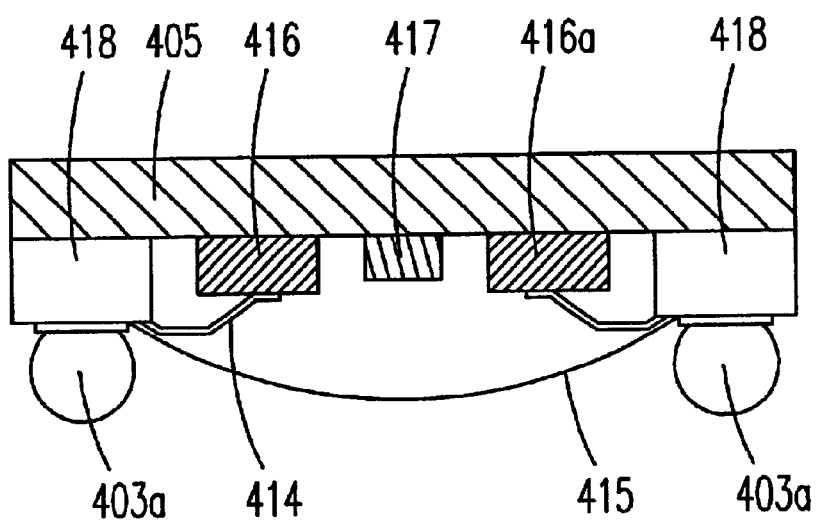
FIG. 5b is a cross-sectional side view of the sub-package with at least a power-dissipating chip, and a top heat-slug and facing down balls according to the present invention.

Please refer to FIG. 5b. The sub-package 401 in FIG. 5a can also be constructed in the form as shown in FIG. 5b. Based on the structure of FIG. 5a, the leads 403 are replaced by the balls 403a. The balls 403a have lower profile and lower interconnection parasites than those of leads 403, and thus the electrical performance can be further improved. For the reasons of increased packaging density and improved electrical performance, power-dissipating chips 416, 416a, control device chips (not shown) and passive chips 417 can be combined into one sub-package. The sub-package can be simplified to be a standard surface-mounting package with a bare top up-facing heat-slug while the sub-package holds only one chip 416.

Figure 6A:
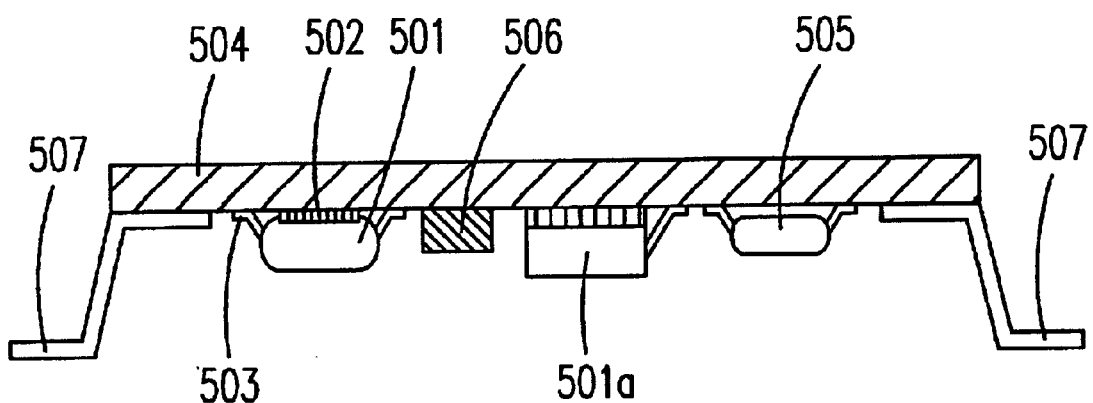
FIG. 6a is a cross-sectional side view of the sub-package with at least a discrete power-dissipating package, and a top heat-slug and facing down leads according to the present invention.

Please refer to FIG. 6a. A derivative packaging art for the sub-package of FIG. 5a is proposed to satisfy miscellaneous applications. In the art, the discrete power-dissipating devices 501, 501a have a bare bottom heat-slug 502 and electrical connection leads 503, and are connected with the heat-slug 504 of the sub-package 500a by the bare bottom heat-slug 502 and leads 503 to provide both electrical and thermal connections between the discrete power-dissipating devices 501, 501a and the heat-slug 504 of the sub-package 500a. Meanwhile, the heat-slug 504 of the sub-package 401 can be selected from a material of metal, ceramic, metal matrix composite and insulated metal substrate and the combination thereof The control device 505 and passive component 506 are also connected with the heat-slug 504 of the sub-package 500a. The electrical interconnection within the discrete power-dissipating devices 501, 501a, the control device 505 and the passive component 506 are achieved by conductive trace (not shown) on the facing-down surface of the heat-slug 504. The sub-package 500a is electrically connected with the motherboard of a power converter by the plurality of symmetric leaded terminals 507, and is thermally connected to the outside by the heat-slug 504. Therefore the electrical conductive pathway of the sub-package 500a is separate from the thermal conductive pathway.

Figure 6B:
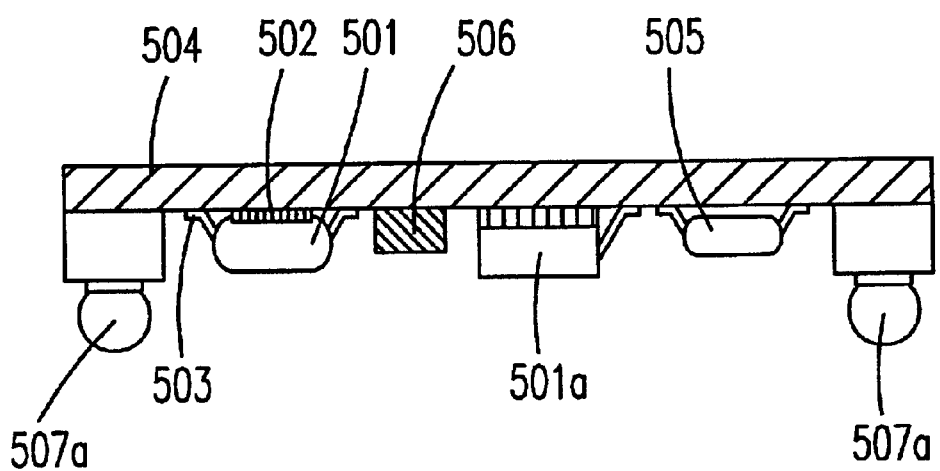
FIG. 6b is a cross-sectional side view of the sub-package with at least a discrete power-dissipating package, and a top heat-slug and facing down balls according to the present invention.

As shown in FIG. 6b, a plurality of symmetric balls 507a can also be responsible for the electrical connection between the sub-package 500b and the motherboard of a power converter.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A package for a power converter, comprising:
    a multi-layer circuit board having a first electrically conductive surface and a second electrically conductive surface opposite to the first electrically conductive surface;
    a heat spreader having at least a heat transfer surface; and a sub-package including a bare top heat-slug, a power-dissipating chip mounted on a first surface of the bare top heat-slug, a plurality of symmetric leads fixedly connected to the bare top heat-slug, and bonding structures connected between the symmetric leads and the power-dissipating chip, wherein the sub-package is disposed between one of the electrically conductive surfaces of the multi-layer circuit board and the heat transfer surface of the heat spreader such that a second surface of the bare top heat slug is in contact with the heat transfer surface of the heat spreader through a thermally conductive insulator to provide a thermally conductive pathway therebetween, and the plurality of symmetric leads are in contact with a first surface of the electrically conductive surfaces of the multi-layer circuit board to provide an electrically conductive pathway therebetween, wherein the plurality of symmetric leads and the heat-slug are disposed in opposite orientations so that the electrically conductive pathway is separate from the thermally conductive pathway.

2. The package of claim 1, wherein the heat-slug is up-facing and the leads are down-facing.

3. The package of claim 1, wherein the heat-slug is down-facing and the leads are up-facing.

4. The package of claim 1, wherein the heat-slug of the sub-package is selected from the group substantially consisting of metal, ceramic, metal matrix composite and insulated metal substrate and the combination thereof.

5. The package of claim 1, wherein the plurality of symmetric leads are selected from the group substantially consisting of dual, four, round-distributed lateral leads.

6. The package of claim 1, wherein the multi-layer circuit board is selected from the group substantially consisting of copper clad laminates and a ceramic hybrid circuit board.

7. The package of claim 1, wherein the heat spreader is selected from the group substantially consisting of metal, ceramic, and metal matrix composite and the combination thereof.

8. The package of claim 1, further comprising a second sub-package mounted onto a second surface of the multi-layer circuit board.

9. A method of packaging a power converter, comprising:

providing a multi-layer circuit board having at least an electrically conductive surface;

providing a heat spreader having at least a heat transfer surface; and disposing a sub-package between the electrically conductive surface of the multi-layer circuit board and the heat transfer surface of the heat spreader, the sub-package having a bare top heat-slug, a power-dissipating chip mounted on a first surface of the bare top heat-slug, a plurality of symmetric leads fixedly connected to the bare top heat-slug, and bonding structures connected between the symmetric leads and the power-dissipating chip, wherein the electrically conductive surface of the multi-layer circuit board is adapted to be electrically connected with the leads of the sub-package to provide an electrically conductive pathway therebetween the heat transfer surface of the heat spreader is adapted to be thermally connected with the heat-slug of the sub-package through a thermally conductive insulator to provide a thermally conductive pathway therebetween, and the electrically conductive pathway is separate from the thermally conductive pathway.

10. The method of claim 9, wherein the heat-slug of the sub-package is selected from the group substantially consisting of metal, ceramic, metal matrix composite and insulated metal substrate and the combination thereof.

11. The method of claim 9, wherein the plurality of symmetric leads are selected from the group substantially consisting of dual, four, round-distributed lateral leads.

12. The method of claim 9, wherein the multi-layer circuit board is selected from the group substantially consisting of copper clad laminates and a ceramic hybrid circuit board.

13. The method of claim 9, wherein the heat spreader is selected from the group substantially consisting of metal, ceramic, and metal matrix composite and the combination thereof.

14. The method of claim 9, wherein the sub-package is mounted onto one surface of the multi-layer circuit board.

15. The method of claim 9, further comprising mounting a second sub-package onto a second surface of the multi-layer circuit board.

16. A sub-package arranged in a package for a power converter, comprising:

a power-dissipating chip;

a bare top heat-slug having a first surface in contact with the power-dissipating chip and a second surface in contact with a heat spreader of the package to provide a thermally conductive pathway for heat transfer from the power-dissipating chip;

a plurality of symmetric leads fixedly mounted on the first surface of the bare top heat-slug and to provide an electrically conductive pathway to a multi-layer circuit board of the package; and bonding structures electrically connected between the symmetric leads and the power dissipating chip for an interconnection, wherein the plurality of symmetric leads and the bare top heat-slug are disposed in opposite orientations so that an electrically conductive pathway is separate from a thermally conductive pathway.

17. The sub-package of claim 16, wherein the bare top heat-slug is selected from the group substantially consisting of: a ceramic substrate, an insulator metal substrate and a metal slug and the combination thereof.

18. A sub-package arranged in a package for a power converter, comprising:

a discrete power-dissipating device;

a bare top heat-slug having a first surface in contact with the discrete power-dissipating device and a second surface in contact with a heat spreader of the package to provide a thermally conductive pathway for heat transfer from the power-dissipating chip;

a plurality of symmetric leads fixedly mounted on the first surface of the bare top heat-slug to provide an electrically conductive pathway to a multi-layer circuit board of the package; and a conductive trace electrically connected between the symmetric leads and the discrete power-dissipating device for an interconnection, wherein the plurality of symmetric leads and the bare top heat-slug are disposed in opposite orientations so that an electrically conductive pathway is separate from a thermally conductive pathway.

19. The sub-package of claim 18, wherein the bare top heat-slug further comprises control devices and passive components.

20. A sub-package arranged in a package for a power converter, comprising:

a power-dissipating chip;

a bare top heat slug having a first surface in contact with the power-dissipating chip and a second surface in contact with a heat spreader of the package to provide a thermally conductive pathway for heat transfer from the power-dissipating chip;

a plurality or symmetric balls fixedly mounted on the first surface of the bare top heat-slug to provide an electrically conductive pathway to a multi-layer circuit board of the package; and bonding structures electrically connected between the symmetric balls and the power-dissipating chip for an interconnection, wherein the plurality of symmetric balls and the bare top heat-slug are disposed in opposite orientations so that an electrically conductive pathway is separate from a thermally conductive pathway.

21. The sub-package of claim 20, wherein the bare top heat-slug is selected from the group substantially consisting of: a ceramic substrate, an insulator metal substrate and a metal slug and the combination thereof.

22. A sub-package arranged in a package for a power converter, comprising:

a discrete power-dissipating device;

a bare top heat-slug having a first surface in contact with the discrete power-dissipating device and a second surface in contact with a heat spreader of the package to provide a thermally conductive pathway for heat transfer from the power-dissipating chip;

a plurality of symmetric balls fixedly mounted on the first surface of the bare top heat-slug to provide an electrically conductive pathway to a multi-layer circuit board of the package, and a conductive trace electrically connected between the symmetric balls and the discrete power-dissipating device for an interconnection, wherein the plurality of symmetric balls and the bare top heat-slug are disposed in opposite orientations so that an electrically conductive pathway is separate from a thermally conductive pathway.

23. The sub-package of claim 22, wherein the bare top heat-slug further comprises control devices and passive components.

* * * * *